(12) United States Patent
Awamori et al.

(10) Patent No.: US 12,021,459 B2
(45) Date of Patent: Jun. 25, 2024

(54) POWER CONVERSION DEVICE

(71) Applicant: Hitachi Astemo, Ltd., Hitachinaka (JP)

(72) Inventors: Shoya Awamori, Hitachinaka (JP); Kenichirou Nakajima, Hitachinaka (JP); Yuta Numakura, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 59 days.

(21) Appl. No.: 17/921,410

(22) PCT Filed: Jan. 22, 2021

(86) PCT No.: PCT/JP2021/002151
§ 371 (c)(1),
(2) Date: Oct. 26, 2022

(87) PCT Pub. No.: WO2021/220563
PCT Pub. Date: Nov. 4, 2021

(65) Prior Publication Data
US 2023/0163693 A1 May 25, 2023

(30) Foreign Application Priority Data
Apr. 30, 2020 (JP) .................. 2020-080810

(51) Int. Cl.
*H02M 7/48* (2007.01)
*H02M 1/12* (2006.01)
(Continued)

(52) U.S. Cl.
CPC ............. *H02M 7/48* (2013.01); *H02M 1/126* (2013.01); *H02M 1/327* (2021.05); *H02M 1/44* (2013.01);
(Continued)

(58) Field of Classification Search
CPC ........ H02M 7/48; H02M 1/327; H02M 1/126; H02M 1/44; H02M 7/003; H02M 7/20936
See application file for complete search history.

(56) References Cited

U.S. PATENT DOCUMENTS 11,296,613 B2 * 4/2022 Nishizawa .............. H02P 27/06
2020/0266724 A1  8/2020 Nishizawa et al.
(Continued)

FOREIGN PATENT DOCUMENTS

| JP | 2009-261139 A | 11/2009 |
|---|---|---|
| JP | 2013-198350 A | 9/2013 |

(Continued)

OTHER PUBLICATIONS

International Search Report with English translation and Written Opinion dated May 11, 2021 in corresponding International Application No. PCT/JP2021/002151.

*Primary Examiner* — Adolf D Berhane
(74) *Attorney, Agent, or Firm* — Foley & Lardner LLP

(57) ABSTRACT

Provided is a power conversion device that achieves both downsizing and improvement in cooling efficiency to have improved reliability. The power conversion device includes a power conversion circuit unit which converts DC power into AC power, a flow path including body for letting a refrigerant for cooling the power conversion circuit unit flow, a filter circuit unit which suppresses electric noise from a wire for transmitting the DC power, and a filter case portion which houses the filter circuit unit, where the filter case portion is formed integrally with the flow path including body, and a gap between the filter case portion and the filter circuit unit is filled with a first resin.

7 Claims, 11 Drawing Sheets

(51) Int. Cl.
*H02M 1/32* (2007.01)
*H02M 1/44* (2007.01)
*H02M 7/00* (2006.01)
*H05K 7/20* (2006.01)
(52) U.S. Cl.
CPC ........ *H02M 7/003* (2013.01); *H05K 7/20936* (2013.01)

(56) References Cited

U.S. PATENT DOCUMENTS

| | | | |
|---|---|---|---|
| 2021/0249967 A1* | 8/2021 | Furuta | H02M 1/44 |
| 2024/0032266 A1* | 1/2024 | Yamanoue | H05K 7/20927 |

FOREIGN PATENT DOCUMENTS

| | | | |
|---|---|---|---|
| JP | 2014-239616 A | 12/2014 | |
| WO | WO-2019/064833 A1 | 4/2019 | |

* cited by examiner

POWER CONVERSION DEVICE

TECHNICAL FIELD

The present invention relates to a power conversion device.

BACKGROUND ART

A power conversion device, when performing quick switching operations for performing DC/AC power conversion, becomes a generation source of electromagnetic noise. To suppress generation of electromagnetic noise, conventionally, a measures of disposing a noise filter circuit has been taken as a countermeasure against electromagnetic noise (to provide electromagnetic compatibility, that is, EMC).

However, to employ the countermeasure, a power conversion device needs to have a space in which components such as a capacitor and a core constituting a noise filter circuit are disposed. Furthermore, it is necessary to consider that heating of a bus bar and components of the noise filter circuit has an effect on degrading and damaging other components. Therefore, improvement in cooling performance is necessary to suppress the temperature of the components of the noise filter within an allowable range.

As a background art of the present invention, the following PTL 1 is known. PTL 1 discloses a configuration in which a noise filter assembly 20A includes a resin member 22 and is fixed to a bottom portion 7a of a case 7 via a flexible insulating sheet 26 made of a silicon-based material or the like.

CITATION LIST

Patent Literature

PTL 1: WO2019/064833 A

SUMMARY OF INVENTION

Technical Problem

In a configuration in PTL 1, when downsizing a power conversion device, there is an issue in fixing of components which may deteriorate reliability of the power conversion device. Thus, there lies a problem in downsizing the power conversion device while improving cooling efficiency of the components to improve reliability of the power conversion device.

Solution to Problem

A power conversion device according to the present invention includes a power conversion circuit unit which converts DC power into AC power, a flow path including body for letting a refrigerant for cooling the power conversion circuit unit flow, a filter circuit unit which suppresses electric noise from a wire for transmitting the DC power, and a filter case portion which houses the filter circuit unit, where the filter case portion is formed integrally with the flow path including body, and a gap between the filter case portion and the filter circuit unit is filled with a first resin.

Advantageous Effects of Invention

According to the present invention, a power conversion device that achieves both downsizing and improvement in cooling efficiency to have improved reliability can be provided.

DESCRIPTION OF EMBODIMENTS

Hereinafter, a configuration of a power conversion device according to a first embodiment of the present invention will now be described with reference to FIGS. 1 to 10.

Configuration of First Embodiment and Power Conversion Device

Figure 1:
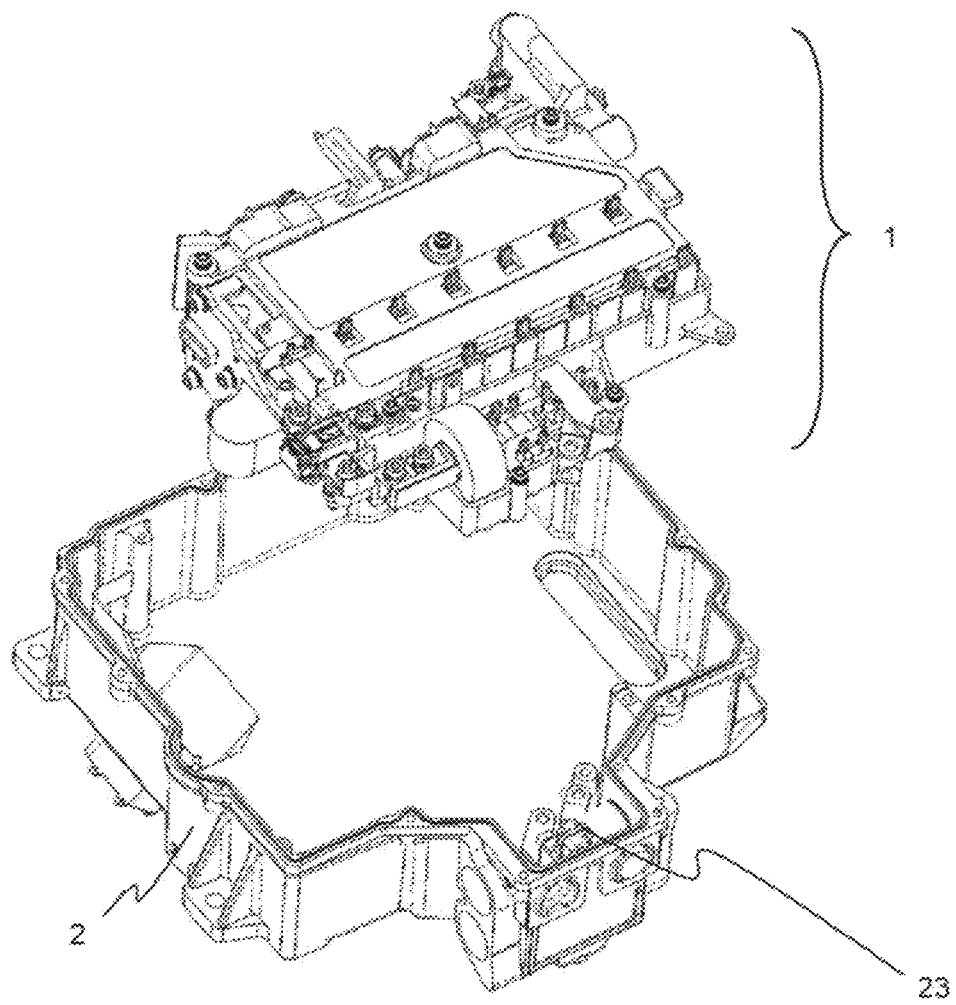
FIG. 1 is a view illustrating an overall configuration of a power conversion device.

FIG. 1 illustrates an overall configuration of a power conversion device 1. The power conversion device 1 is housed in a housing 2 and is integrally fixed to the housing 2 by a connector 23. The connector 23 and its surroundings will be described later in detail with reference to FIG. 4.

The housing 2 is grounded to a ground potential, has a bottom portion, and is formed in a box shape with an open top. There is a space for housing the power conversion device 1 in the housing 2. The housing 2 is formed of a metal such as aluminum and iron, and the entire structure can be formed by casting, for example, aluminum die casting. Although not illustrated, a high-voltage battery connected to the power conversion device 1 is disposed outside the housing 2, and is electrically connected to the mold bus bar 4 from the outside of the filter case portion 3 described later with reference to FIG. 2.

Figure 2:
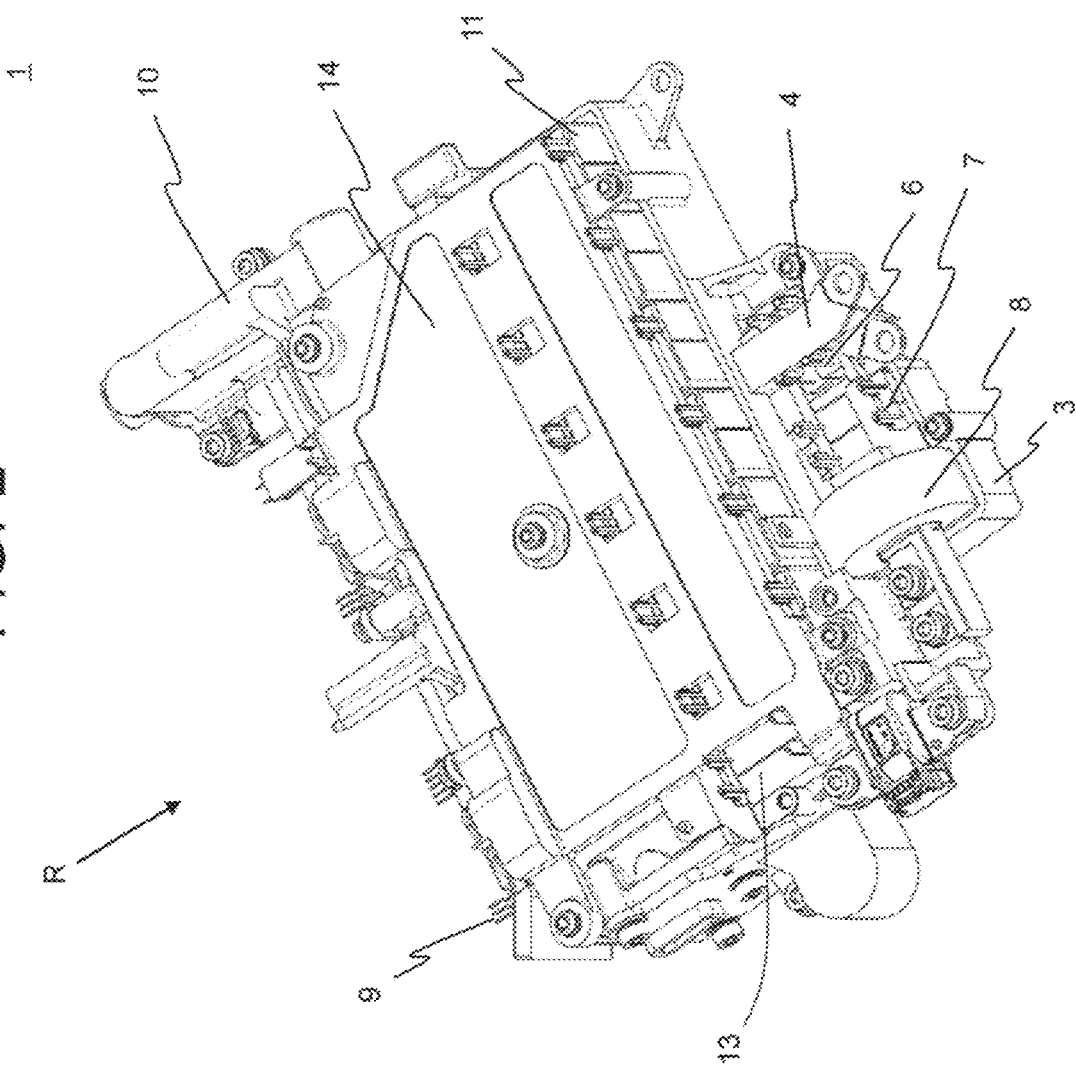
FIG. 2 is an explanatory view of the power conversion device in FIG. 1.

FIG. 2 is an explanatory view of the power conversion device 1 in FIG. 1. Note that an arrow R is a looking direction for explaining FIG. 3 to be described later.

The power conversion device 1 includes a filter case portion 3, a mold bus bar 4, a power semiconductor module 9 that converts DC power into AC power, a flow path including body 10, a smoothing capacitor 11, a Y capacitor 13, and a DC mold bus bar 14. The filter case portion 3 has a shape integrated with the flow path including body 10, and the flow path including body 10 is entirely housed inside the housing 2.

The mold bus bar 4 is housed inside the filter case portion 3 integrated with the flow path including body 10, and is electrically connected to the power semiconductor module 9. The mold bus bar 4 includes a first capacitor 6, a second capacitor 7, a magnetic core member 8 (hereinafter, core 8), and electronic components (with no reference sign) such as an EMC filter circuit and a discharge resistor. Details will be described later.

Figure 3:
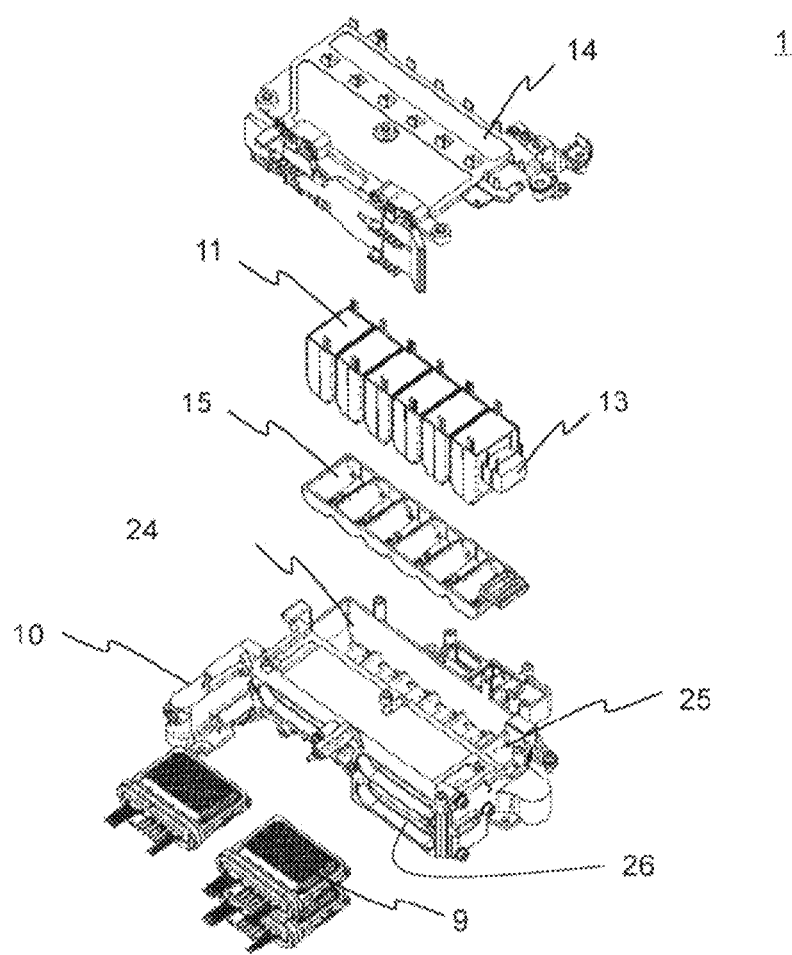
FIG. 3 is an exploded view of the power conversion device in FIG. 2.

FIG. 3 is an exploded view of the power conversion device 1, and illustrates the power conversion device 1 as viewed along a direction indicated by the arrow R shown in FIG. 2.

The flow path including body 10 is formed of a metal such as aluminum and iron, and can be formed by casting, for example, aluminum die casting.

The flow path including body 10 has a structure that houses therein the power semiconductor module 9, and includes a power semiconductor module mounting port 26 for housing the power semiconductor module 9. The power semiconductor module attachment port is provided at one of side surface portions of the flow path including body 10. The power semiconductor module mounting port 26 is provided by the same number as the number of the power semiconductor module 9.

The flow path including body 10 includes inside a housing portion for housing the power semiconductor module 9, and the housing portion has a shape extending in a substantially horizontal direction deeper into the flow path including body 10 from the power semiconductor module mounting port 26. As illustrated in FIG. 2, the power semiconductor module 9 is fixed in the flow path including body 10 by a fixing member (not illustrated) with an input/output terminal portions protruding to the outside of the flow path including body 10.

The flow path including body 10 includes a smoothing capacitor housing portion 24 and a Y capacitor housing portion 25 to respectively house the smoothing capacitor 11 and the Y capacitor 13. A gap between the smoothing capacitor 11 and the Y capacitor 13, which are components of a power conversion circuit unit to be described later, and a housing portion is filled with a potting resin 15 (hereinafter, resin 15) and the resin 15 is cured therein. Accordingly, the heat generated by the components of the power conversion circuit unit is released via the resin 15 into a refrigerant, described later, flowing in the flow path including body 10.

The resin 15 is a thermally conductive resin, and is capable of suppressing vibration of the smoothing capacitor 11 and the Y capacitor 13 to contribute to fixing of circuit components together with the ground bus bar 5, described later, to the power conversion device 1. Thus, the number of dedicated components required for fixing such as screws can be reduced, and a fixing space required for placing the components is also reduced.

The DC mold bus bar 14 is held by the flow path including body 10 and disposed so as to extend in parallel with the power semiconductor module mounting port 26 and a surface of the smoothing capacitor 11 where connection terminals exist. The DC mold bus bar 14 is electrically connected to the power semiconductor module 9 and the smoothing capacitor 11. The DC mold bus bar 14 is molded with an insulating resin.

The power conversion circuit unit (not illustrated) included in the power conversion device 1 will now be described. The power conversion circuit unit includes a switching element and a diode, such as insulated gate bipolar transistors (IGBTs), that operate as an upper arm and a switching element and a diode, such as IGBTs, that operate as a lower arm. The switching element of the upper arm and the switching element of the lower arm convert DC power into AC power.

The power conversion circuit unit includes the power semiconductor module 9 that converts DC power into AC power, the smoothing capacitor 11 that smooths the DC power supplied to the power semiconductor module 9, and the Y capacitor 13. The smoothing capacitor 11 is connected between a high-voltage battery and the power semiconductor module 9, smooths DC power, and supplies the smoothed DC power to the power semiconductor module 9. That is, the smoothing capacitor 11 electrically connects the high-voltage battery to the power conversion circuit unit. The Y capacitor 13 is connected between the power semiconductor module 9 and the ground potential, and suppresses noise generated by the power semiconductor module 9.

Figure 4:
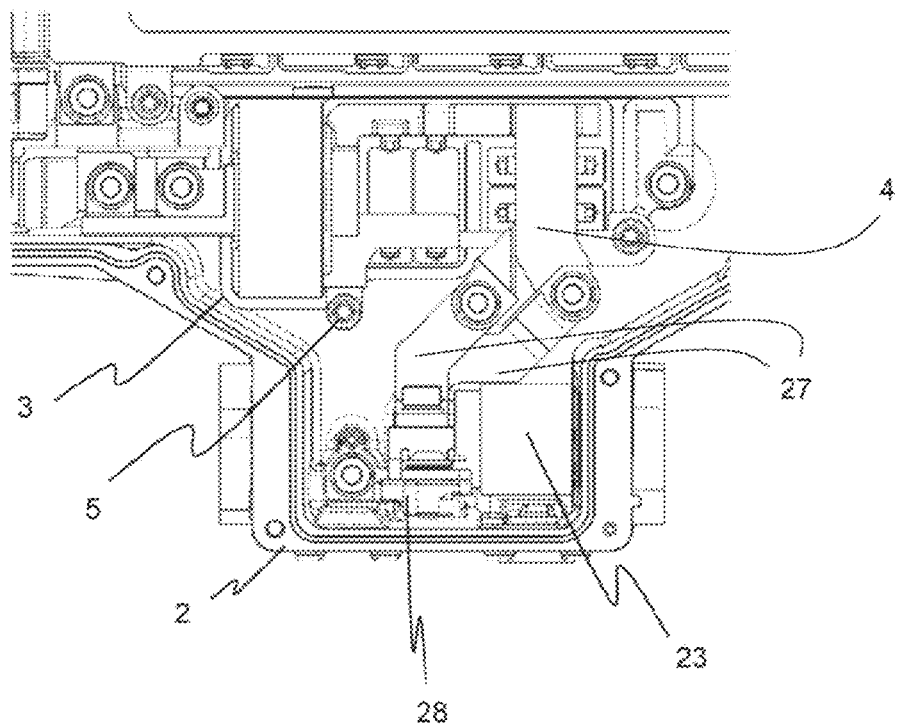
FIG. 4 is a view of a connector and its surroundings in FIG. 1.

FIG. 4 is a view of the connector 23 and its surroundings in FIG. 1. Note that FIG. 4 is a view of the connector 23 and its surroundings as viewed from the open surface side of the upper portion of the housing 2 with the power conversion device 1 housed in the housing 2.

The connector 23 is fixed to the housing 2 by a fastening member 28. The connector bus bar 27 is electrically connected to the connector 23. The mold bus bar 4 integrated with the filter case portion 3 is electrically connected to the connector bus bar 27. Accordingly, the filter case portion 3 is electrically connected to the housing 2 via the mold bus bar 4, the connector bus bar 27, the connector 23, and the fastening member 28.

The connector 23 is electrically connected through an opening provided on a side surface of the housing 2 to the high-voltage battery disposed outside the housing 2. The connector 23 is electrically connected also to the power semiconductor module 9. Accordingly, the bus bar members such as the connector bus bar 27 and the mold bus bar 4 are also electrically connected to the power semiconductor module 9 via the connector 23 in a similar manner.

Figure 5:
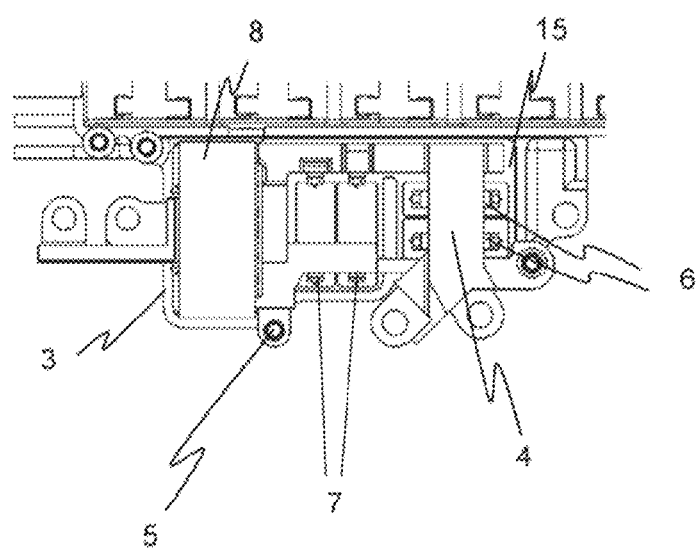
FIG. 5 is a view illustrating a mold bus bar disposed in a filter case portion.

FIG. 5 is a view illustrating a mold bus bar disposed in a filter case portion.

The filter case portion 3 is provided with a space in which the mold bus bar 4 is housed. Part of the internal space is a housing portion for the core 8 which is part of the mold bus bar 4. The housing portion for the core 8 has a form of a bottom surface having a round shape along the circumferential shape of the core 8.

The mold bus bar 4, the first capacitor 6, and the second capacitor 7 housed in the filter case portion 3 are placed so as to be in contact with bottom surfaces (in the depth side in the drawing in FIG. 5) of the filter case portion 3. Gaps between the mold bus bar 4 and the capacitors 6 and 7 are filled with the resin 15 and the resin 15 is cured therein. Accordingly, part of the mold bus bar 4 is fixed together with the first capacitor 6, the second capacitor 7, and the core member 8 by resin 15. Part of the mold bus bar 4 runs above across an upper portion (in a viewer's side in the drawing) of first capacitor 6. Components other than the mold bus bar 4 may be housed as long as the space in the filter case portion 3 allows.

Figure 6:
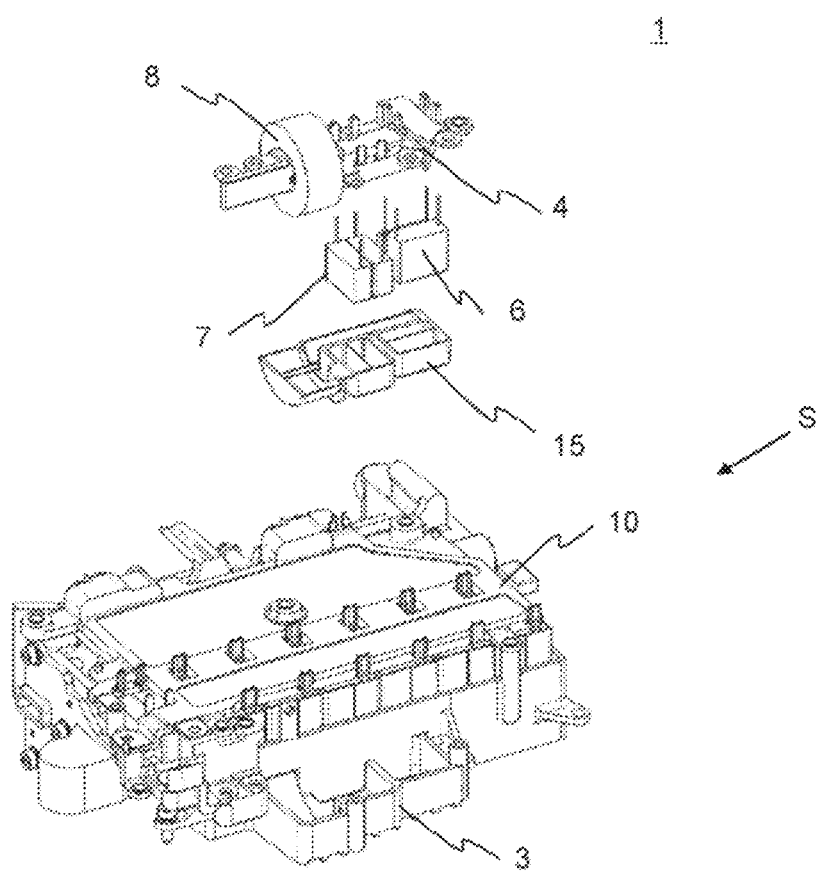
FIG. 6 is an exploded view of the inside of the filter case portion.

FIG. 6 is an exploded view of the inside of the filter case portion. Note that an arrow S indicates a viewing direction for explaining FIG. 8.

The first capacitor 6 and the second capacitor 7 function as part of the mold bus bar 4 as a filter circuit. The first capacitor 6 is disposed such that a longitudinal direction thereof is parallel to a longitudinal direction of the filter case portion 3. The second capacitor 7 is disposed such that a longitudinal direction thereof is parallel to a lateral direction of the filter case portion 3. The core 8 is held by the mold bus bar 4 and housed so as to be concentric with the circular bottom surface of the filter case portion 3 described later.

Each of the first capacitor 6, the second capacitor 7, and the core 8 is a filter circuit having an effect of suppressing noise, but they all disadvantageously generate heat. When a current flows in a bus bar, represented by the mold bus bar 4, used in the power conversion device 1, the electrical resistance of the bus bar material causes heat loss, and heat transfers from connection portions to the first capacitor 6 and the second capacitor 7. The transferred heat may cause damage or deterioration of the first capacitor 6 and the second capacitor 7. Thus, it is necessary to suppress heat in order to maintain the function of suppressing noise. That is, since the mold bus bar 4 housed in the filter case portion 3 generates heat by a current flowing therein, it is necessary to actively transfer the heat to the wall surface of the filter case portion 3. Thus, releasing heat by heat conduction via the resin 15 is necessary.

Gaps between the filter case portion 3 and the mold bus bar 4, the core member 8, the first capacitor 6, and the second capacitor 7 the resin 15 are filled with the resin 15 and the resin 15 is cured therein. Accordingly, heat generated by the mold bus bar 4, the first capacitor 6, and the second capacitor 7 is thermally conducted to the filter case portion 3 via the resin 15. As a result, the mold bus bar 4, the first capacitor 6, and the second capacitor 7 are cooled by the refrigerant flowing in the flow path including body 10 integrated with the filter case portion 3.

The resin 15 is a resin member having thermal conductivity and electrical insulation properties, and not only improves cooling efficiency but also fixes a relative position of the mold bus bar 4 placed in the filter case portion 3. Although the filling rate of the resin 15 with respect to the volume of the housing portion of the filter case portion 3 is not specified, a high filling rate of the resin 15 is preferable from the viewpoint of efficient cooling.

Figure 7:
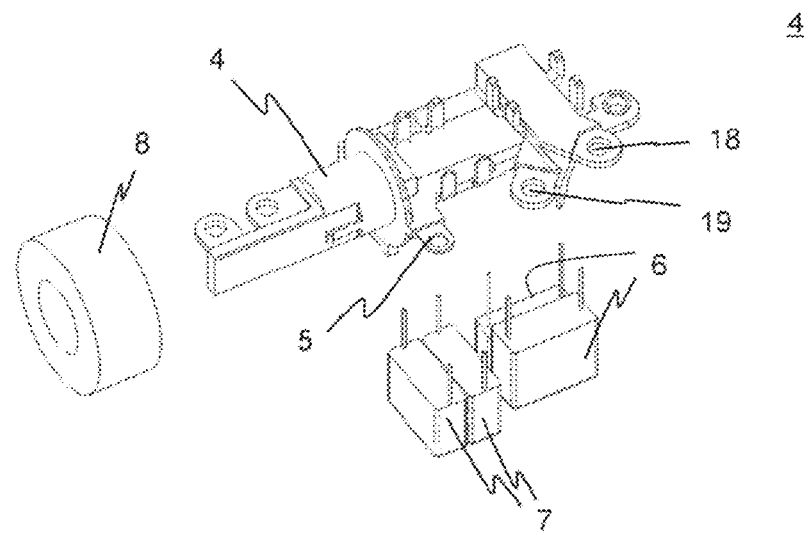
FIG. 7 is an exploded view of a mold bus bar (filter circuit).

FIG. 7 is an exploded view of the mold bus bar 4.

The mold bus bar 4 is provided between the high-voltage battery and the smoothing capacitor 11 as a filter circuit unit that suppresses noise from a wire for transmitting DC power. The electromagnetic noise generated by the power conversion circuit unit when converting power is suppressed by the core 8, the first capacitor 6, and the second capacitor 7.

The mold bus bar 4 includes a positive electrode bus bar 18, a negative electrode bus bar 19, a ground bus bar 5, a first capacitor 6, a second capacitor 7, and a core 8 which are disposed along an inner wall of the filter case portion 3. The mold bus bar 4 includes a ground bus bar 5 as a component constituting a noise filter. At least one of the positive electrode bus bar 18 and the negative electrode bus bar 19, described later, and its surroundings are molded and sealed with resin to secure insulation between the bus bars of the respective phases and to integrate the bus bars as a part. This insulating resin is a second resin different from the resin 15 used to fill the filter case portion 3. Accordingly, the mold bus bar 4 is reliably kept insulated, and its components are integrally held together.

The mold bus bar 4 is provided as an integrated part by molding and fixing with the second resin to avoid assembling becoming complicated which happens when the positive electrode bus bar 18 and the negative electrode bus bar 19 unfixed to each other are housed in the filter case portion 3. This facilitates assembling in the filter case portion 3. Furthermore, insert molding can be employed by using the bus bar portion as an insert member, which makes assembling easy.

Although the positive electrode bus bar 18, the negative electrode bus bar 19, and the ground bus bar 5 are integrated in the mold bus bar 4, a method may be employed that only one or two of the positive electrode bus bar 18, the negative electrode bus bar 19, and the ground bus bar 5 are integrally formed with the second resin as an insert member. In addition, each of those bus bars may be formed separately from each other as a single member.

As described above, the first capacitor 6 and the second capacitor 7 suppress the electromagnetic noise of a current flowing in the filter circuit unit 4. The first capacitor 6 and the second capacitor 7 are disposed at the connection terminal surfaces of the positive electrode bus bar 18 and the negative electrode bus bar 19 so as the longitudinal directions of the first capacitor 6 and the second capacitor 7 to be perpendicular to each other.

One end of the first capacitor 6 is electrically connected to the positive electrode bus bar 18 and the other end of the first capacitor 6 is electrically connected to the negative electrode bus bar 19. One end of the second capacitor 7 is connected to the positive electrode bus bar 18 or the negative electrode bus bar 19 and the other end of the second capacitor 7 is grounded to the ground potential by the ground bus bar 5.

The second capacitor 7 is connected to the filter case portion 3 to be connected to the metal housing 2 grounded to the ground potential. This sets the filter case portion 3 to the ground potential. Realizing the connection of the second capacitor 7 to the ground potential by connecting the second capacitor 7 to the filter case portion 3 makes an attaching work easy. Furthermore, positioning a connection point between the filter case portion 3 and the metal housing 2 grounded to the ground potential in the vicinity of the second capacitor 7 is suitable for taking measures against electromagnetic noise from the viewpoint of a wiring length.

The core 8 is made of a magnetic material and has a hollow cylindrical shape of which inner circumference forms a through hole. The positive electrode bus bar 18 and the negative electrode bus bar 19 are configured to pass through the through hole in the center of the core 8, and this configuration realizes integrally fixing the positive electrode bus bar 18 and the negative electrode bus bar 19 to the mold bus bar 4. The core 8 is disposed so as to surround the positive electrode bus bar 18 and the negative electrode bus bar 19, whereby the core 8 absorbs electromagnetic noise of currents flowing in the bus bars to suppress electromagnetic noise. The positive electrode bus bar 18 and the negative electrode bus bar 19 penetrating the core 8 are electrically connected to the DC mold bus bar 14. A GND bus bar (with no reference sign) of the Y capacitor 13 is also fixed to the DC mold bus bar 14.

The positive electrode bus bar 18 and the negative electrode bus bar 19 are electrically connected to the first capacitor 6, the second capacitor 7, and the DC mold bus bar 14 by the connection described above. The positive electrode bus bar 18 and the negative electrode bus bar 19 are electrically connected also to the connector bus bar 27 described above. The positive electrode bus bar 18 and the negative electrode bus bar 19 include terminal portions for electrically connecting to the first capacitor 6 and the second capacitor 7. Note that the connection may be made by any general way of electric connection, such as connection by welding, caulking, and screw-fastening.

The ground bus bar 5 will now be described. The ground bus bar 5 is connected to one of terminals of the second capacitor 7. The ground bus bar 5 is fixed to a rim surface of the filter case portion 3 by screw-fastening, and is electrically connected to the same potential as the ground potential of the housing 2 fastened to the flow path including body 10 via the filter case portion 3. The ground bus bar 5 may be directly connected to the housing 2. The second capacitor 7 is thereby connected to the ground potential. A fastening element such as a screw is used for connecting the ground bus bar 5 to the filter case portion 3. This functions to fix the position of the mold bus bar 4, which contributes to improvement of vibration resistance of the components.

Figure 8:
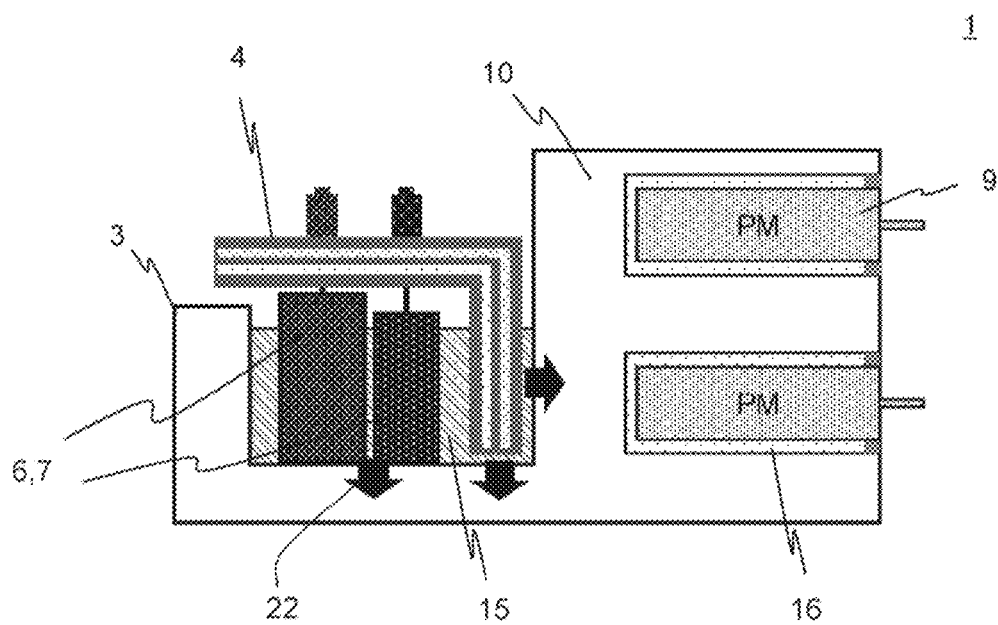
FIG. 8 is a cross-sectional view illustrating a structure of the power conversion device according to a first embodiment of the present invention.

FIG. 8 is a cross-sectional view of the power conversion device 1 according to the first embodiment of the present invention. Note that FIG. 8 is a view of the power conversion device 1 as viewed along the direction indicated by the arrow S in FIG. 6.

As described above, the power conversion device 1 is configured that the flow path including body 10 is integrated with the filter case portion 3 to be downsized. The flow path including body 10 includes the power semiconductor module 9 and a refrigerant flow path 16 around the power semiconductor module 9. A refrigerant is made to flow in the refrigerant flow path 16 for cooling. The resin 15 that has filled the filter case portion 3 and is cured therein fixes the mold bus bar 4 and the capacitors 6 and 7. This allows heat generated by the mold bus bar 4 and the capacitors 6 and 7 to be released to the refrigerant in the refrigerant flow path 16 via the resin 15, the filter case portion 3, and the flow path including body 10. Accordingly, both downsizing and improvement in cooling efficiency of the power conversion device 1 can be achieved, thereby facilitating reliability.

In FIG. 8, the mold bus bar 4 is schematically illustrated to have an L-shaped cross-sectional view. The upper surface side (upper side in the drawing) of the L shape is necessary for welding to the terminals of the capacitors 6 and 7. However, it is not expectable that this portion releases heat to the filter case integrally formed with the flow path including body 10. To release heat generated by this bus bar portion, such a portion that is intentionally provided along a wall surface is necessary. Such a portion that runs along the inner peripheral wall surface to release heat is disposed in parallel along the rim surface of the filter case portion 3. With the capacitors 6 and 7, the magnetic core 8, and the mold bus bar 4 embedded and fixed in the potting resin 15, the effect of cooling the EMC components can be improved and this also improves the reliability of the power conversion device.

The first capacitor 6 and the second capacitor 7, which are disposed as described above in the present embodiment, may instead be disposed so as the longitudinal directions thereof to be parallel or to have an angle with respect to each other. Furthermore, the first capacitor 6 and the second capacitor 7, which are disposed so as bottom surfaces thereof to be in contact with the bottom surface of the filter case portion 3, may instead be disposed so as side surfaces thereof to be in contact with each other. Although two first capacitors and two second capacitors are placed in FIGS. 6 and 7, a single first capacitor and a single second capacitor may be placed.

In addition, such a method may be employed that the resin 15 in a molten state is injected to fill a gap between the capacitors 6 and 7 and the capacitor housing portion of the filter case portion 3 and cured, or the capacitors 6 and 7 may be immersed in the resin 15 in a molten state previously injected in the capacitor housing portion and then the resin 15 may be cured to fix the capacitors 6 and 7.

Figure 9:
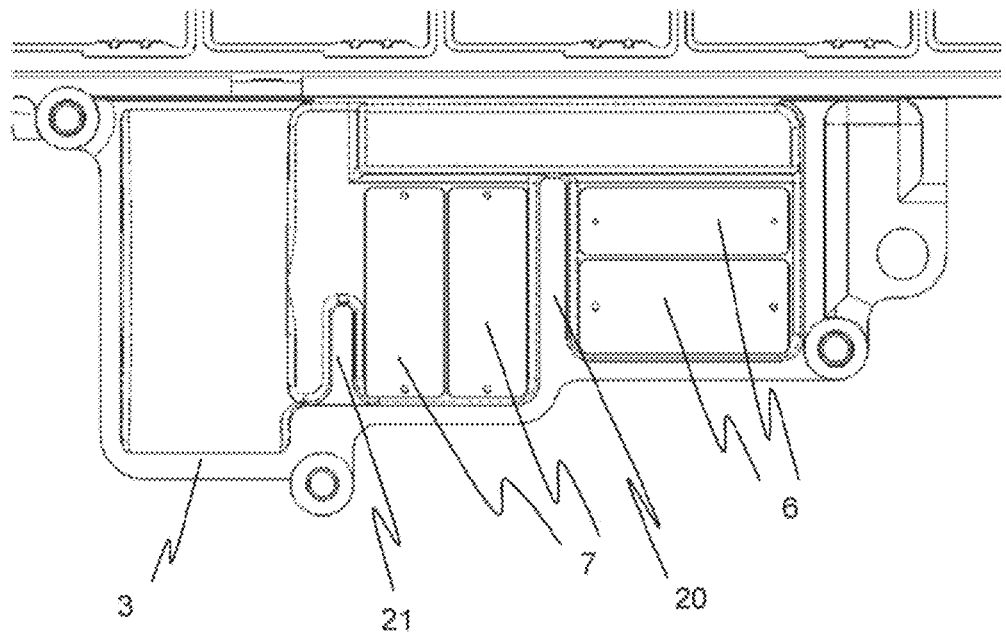
FIG. 9 is a view for explaining arrangement of capacitors inside the filter case portion.

FIG. 9 is a view for explaining the arrangement of the capacitors 6 and 7 inside the filter case portion 3.

The filter case portion 3 is formed integrally with the flow path including body 10 to have a surrounded space with an opening in an upper portion (in a viewer's side in the drawing) and a rim surface surrounding the opening, so that the space houses the components of the mold bus bar 4 as a filter circuit unit.

The first capacitor 6 and the second capacitor 7 are separated from each other by a first partition wall 20 which is part of the filter case portion 3 provided between the first capacitor 6 and the second capacitor 7. Similarly, a second partition wall 21 is provided between the core 8 and the second capacitor 7. The first partition wall 20 and the second partition wall 21 are part of the filter case portion 3. This increases the number of surfaces by which the capacitors 6 and 7 are in proximity to the filter case portion 3, and thereby causes heat transfer 22 of the heat generated by the capacitors 6 and 7 to the filter case portion 3 of which temperature is relatively low, whereby the cooling performance can be enhanced. Furthermore, the partition walls provided partially around the capacitors 6 and 7 can also enhance fixing of the capacitors 6 and 7. The first partition wall 20 and the second partition wall 21 for fixing the capacitors 6 and 7 are not necessarily provided.

Figure 10:
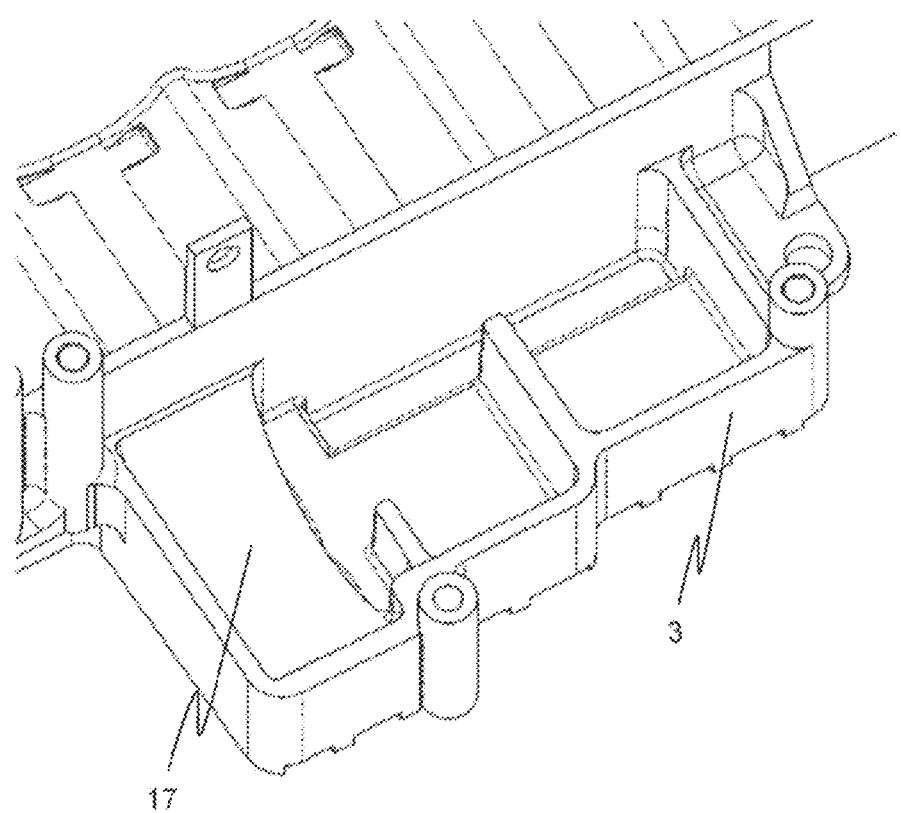
FIG. 10 is a view for explaining an inner wall surface, provided around a core, of the filter case portion.

FIG. 10 is a perspective view for explaining an inner wall surface 17, of the filter case portion 3, that houses the core 8.

As described above, the core 8 suppresses the electromagnetic noise by absorbing fluctuation of the current flowing in the mold bus bar 4 penetrating the core 8. During this absorption, the core 8 self-generates heat and raises its temperature. Thus, the cooling performance around the core 8 needs to be enhanced.

The inner wall surface 17 is part of the filter case portion 3, and is curved into a circular circumferential surface along the shape of the outer surface of the core 8. The resin 15 described above fills a gap between the core 8 and the inner wall surface 17 and is cured therein (not illustrated). This makes, with the mold bus bar 4 housed, the distance between the inner wall surface 17 of the filter case portion 3 and the outer circumferential portion of the core 8 constant, and thus the thickness of the filled resin 15 can be made thin and uniform. As a result, the heat of the core member 8 can be efficiently transferred to the filter case portion 3 of which temperature is relatively low, and the cooling performance of the core 8 can be enhanced. Note that such a configuration in which cooling efficiency is improved by forming the shape of the inner wall surface 17 to be further closer along the core 8 may be employed.

According to the first embodiment of the present invention described above, the following operational effects are obtained.

(1) The power conversion device 1 includes the power conversion circuit unit which converts DC power into AC power, the flow path including body 10 for letting the refrigerant for cooling the power conversion circuit unit flow, the filter circuit unit 4 which suppresses electric noise from a wire for transmitting DC power, and the filter case portion 3 which houses the filter circuit unit 4, where the filter case portion 3 is formed integrally with the flow path including body 10, and a gap between the filter case portion 3 and the filter circuit unit 4 is filled with the first resin 15. With this configuration, a power conversion device that achieves both downsizing and improvement in cooling efficiency to have improved reliability can be provided.

(2) The filter circuit unit 4 of the power conversion device 1 includes the positive electrode bus bar 18, the negative electrode bus bar 19, the core member 8 which is a magnetic body and disposed to surround the positive electrode bus bar 18 and the negative electrode bus bar 19, the first capacitor 6 having one end connected to the positive electrode bus bar 18 and another end connected to the negative electrode bus bar 19, and the second capacitor 7 having one end connected to the positive electrode bus bar 18 and the negative electrode bus bar 19 and another end grounded to the ground potential, where the positive electrode bus bar 18, the negative electrode bus bar 19, the core member 8, the first capacitor 6, and the second capacitor 7 are disposed along the inner wall surface of the filter case portion 3. With this configuration, both downsizing and improvement in cooling efficiency of the power conversion device 1 can be achieved.

(3) The filter case portion 3 of the power conversion device 1 has an inner wall surface 17 that is along an outer shape of the core member 8. With this configuration, the cooling efficiency of the core 8 that easily generates heat can be improved.

(4) The filter case portion 3 of the power conversion device 1 includes a first partition wall 20 that separates the first capacitor 6 and the second capacitor 7 from each other. With this configuration, the cooling efficiency of the capacitor that is easily affected by generated heat can be improved.

(5) The filter case portion 3 of the power conversion device 1 includes a second partition wall 21 that separates the second capacitor 7 and the core member 8 from each other. With this configuration, both improvement in cooling efficiency of the capacitor portion which is easily affected by generated heat and improvement in cooling efficiency of the bus bar portion which easily generates heated can be achieved.

(6) The power conversion device 1 includes the housing 2 made of metal and grounded to the ground potential, where the filter case portion 3 is electrically connected to the housing 2, and the second capacitor 7 is electrically connected to the filter case portion 3. This also contributes to downsizing of the entire configuration while facilitating assembling.

(7) The power conversion device 1 includes the ground bus bar 5 which connects the second capacitor 7 to the filter case portion 3, where at least one of the positive electrode bus bar 18 and the negative electrode bus bar 19, and the ground bus bar 5 are integrally molded and sealed with the second resin member, and the filter case portion 3 has the rim surface surrounding the opening, and the ground bus bar 5 is fixed to the rim surface. This configuration enhances fixing of the components.

Note that the above description is merely of examples. When interpreting the invention, there is no limitation nor restriction on the corresponding relationship between the matters described in the above embodiments and the matters described in the claims. For example, a configuration like that of a power conversion device 1A according to a second embodiment illustrated in FIG. 11 may be adopted.

Second Embodiment

Figure 11:
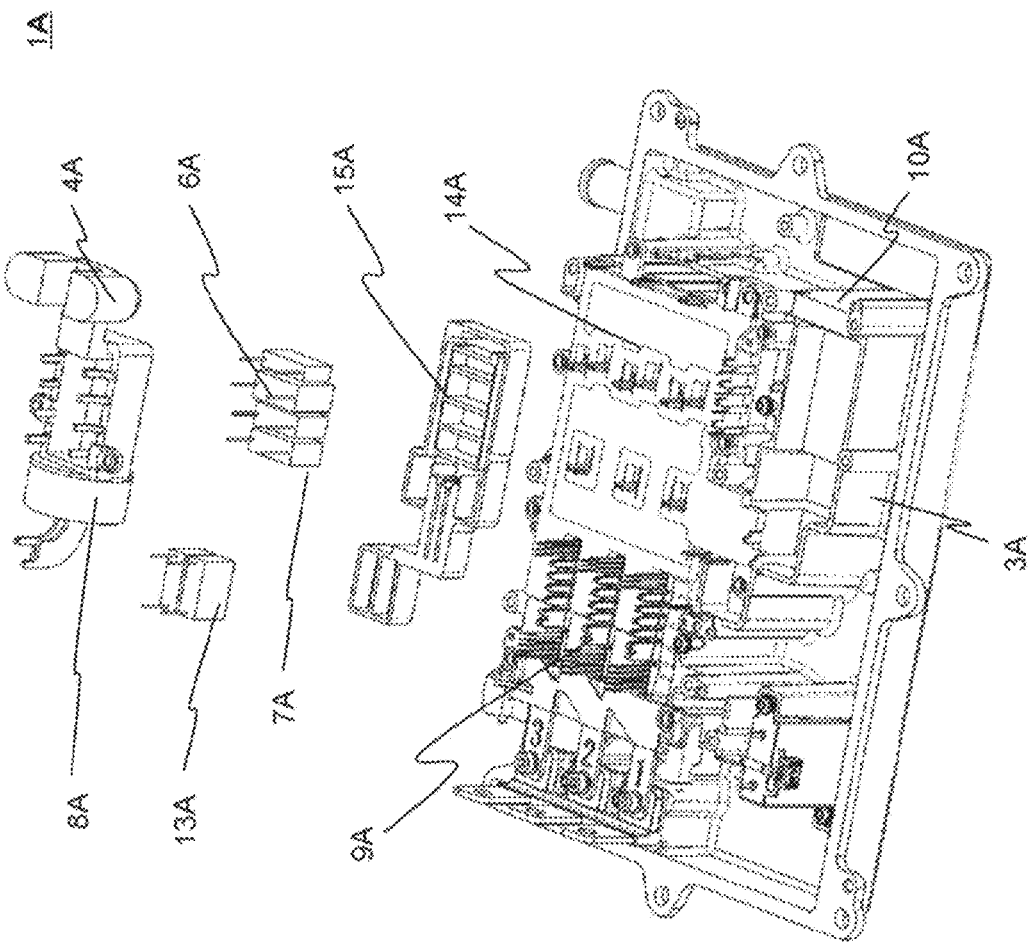
FIG. 11 is an exploded view of the power conversion device according to a second embodiment of the present invention.

A power conversion device 1A illustrated in FIG. 11 has the same basic configuration as the power conversion device 1 of the first embodiment. The structural difference from the first embodiment is that a housing portion of a filter case portion 3A is continuous to a housing portion of a Y capacitor 13A of a flow path including body 10A. A resin 15A fills a housing portion integrated with a portion from the filter case portion 3A to the housing portion for the Y capacitor, and is cured therein. This eliminates the need of dividing the portion filled with the resin 15A. Furthermore, similarly to the first embodiment, fixing the noise filter circuit components with the resin 15A eliminates the need of an additional component necessary for fixing. Furthermore, heat transfer 22 via the resin 15A to the flow path including body 10A of which temperature is relatively low is caused, so that, similarly, the cooling performance can be improved by the refrigerant flowing in the flow path including body 10A.

Figure 12:
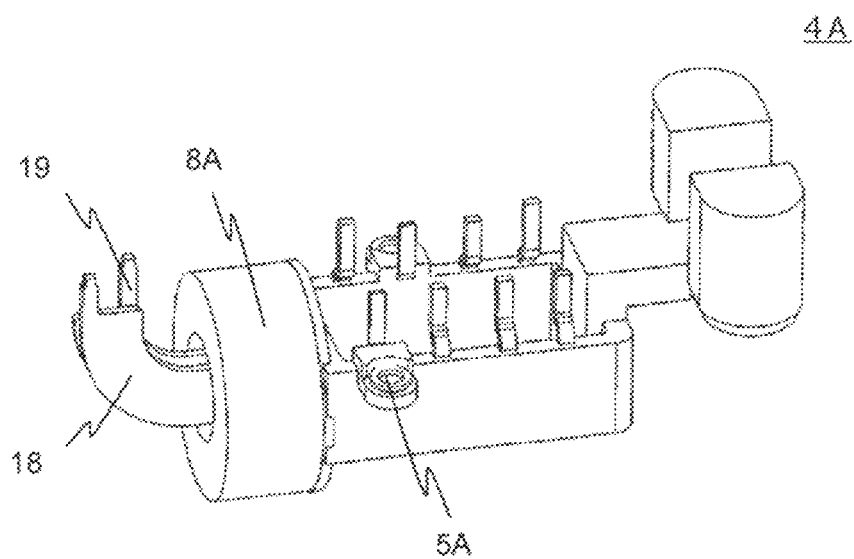
FIG. 12 is for explaining the mold bus bar in FIG. 11.

FIG. 12 illustrates a mold bus bar 4A placed in the power conversion device 1A in FIG. 11. Even when the positions of the positive electrode bus bar 18, the negative electrode bus bar 19, and a ground bus bar 5A and shapes or the like thereof are different from those of the power conversion device 1 according to the first embodiment, there is no difference in the state of the filled resin 15A as illustrated in FIG. 11. Thus, the same effect as that of the first embodiment can be obtained.

As described above, deletion, replacement with a different configuration, and addition of a different configuration can be made without departing from the technical idea of the invention, and aspects of the invention are also included in the scope of the present invention.

REFERENCE SIGNS LIST 1 power conversion device
2 housing
3, 3A filter case portion
4, 4A mold bus bar
5, 5A ground bus bar
6, 6A first capacitor
7, 7A second capacitor
8, 8A magnetic core member
9, 9A power semiconductor module
10, 10A flow path including body
11 smoothing capacitor
13, 13A Y capacitor
14, 14A DC mold bus bar
15, 15A first resin
16 refrigerant flow path
17 inner wall surface
18 positive electrode bus bar
19 negative electrode bus bar
20 first partition wall
21 second partition wall
22 heat transfer
23 connector
24 smoothing capacitor housing portion
25 Y capacitor housing portion
26 power semiconductor module mounting port
27 connector bus bar
28 fastening member

The invention claimed is:

1. A power conversion device comprising:
a power conversion circuit unit which converts DC power into AC power;
a flow path including body for letting a refrigerant for cooling the power conversion circuit unit flow;
a filter circuit unit which suppresses electric noise from a wire for transmitting the DC power; and
a filter case portion which houses the filter circuit unit, wherein the filter case portion is formed integrally with the flow path including body, and a gap between the filter case portion and the filter circuit unit is filled with a first resin.

2. The power conversion device according to claim 1, wherein the filter circuit unit includes a positive electrode bus bar, a negative electrode bus bar, a core member which is a magnetic body and disposed to surround the positive electrode bus bar and the negative electrode bus bar, a first capacitor having one end connected to the positive electrode bus bar and another end connected to the negative electrode bus bar, and a second capacitor having one end connected to the positive electrode bus bar and the negative electrode bus bar and another end grounded to a ground potential, the positive electrode bus bar, the negative electrode bus bar, the core member, the first capacitor, and the second capacitor are disposed along an inner wall surface of the filter case portion.

3. The power conversion device according to claim 2, wherein the filter case portion includes the inner wall surface formed along an outer surface shape of the core member.

4. The power conversion device according to claim 2, wherein the filter case portion includes a first partition wall that separates the first capacitor and the second capacitor from each other.

5. The power conversion device according to claim 2, wherein the filter case portion includes a second partition wall that separates the second capacitor and the core member from each other.

6. The power conversion device according to claim 2, further comprising a housing made of metal and grounded to the ground potential, wherein the filter case portion is electrically connected to the housing, and the second capacitor is electrically connected to the filter case portion.

7. The power conversion device according to claim 6, further comprising a ground bus bar which connects the second capacitor to the filter case portion, wherein at least one of the positive electrode bus bar and the negative electrode bus bar, and the ground bus bar are integrally molded and sealed with a second resin member, and the filter case portion has a rim surface surrounding an opening, and the ground bus bar is fixed to the rim surface.

* * * * *